United States Patent
Duan et al.

(10) Patent No.: US 10,319,589 B2
(45) Date of Patent: Jun. 11, 2019

(54) HIGH PERFORMANCE THIN FILMS FROM SOLUTION PROCESSIBLE TWO-DIMENSIONAL NANOPLATES

(71) Applicant: THE REGENTS OF THE UNIVERSITY OF CALIFORNIA, Oakland, CA (US)

(72) Inventors: Xiangfeng Duan, Los Angeles, CA (US); Yu Huang, Los Angeles, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 0 days.

(21) Appl. No.: 15/510,618

(22) PCT Filed: Sep. 10, 2015

(86) PCT No.: PCT/US2015/049507
§ 371 (c)(1),
(2) Date: Mar. 10, 2017

(87) PCT Pub. No.: WO2016/040690
PCT Pub. Date: Mar. 17, 2016

(65) Prior Publication Data
US 2017/0194144 A1   Jul. 6, 2017

Related U.S. Application Data

(60) Provisional application No. 62/049,961, filed on Sep. 12, 2014.

(51) Int. Cl.
*H01L 21/20* (2006.01)
*H01L 21/02* (2006.01)
(Continued)

(52) U.S. Cl.
CPC ........ *H01L 21/02628* (2013.01); *B05D 1/005* (2013.01); *B05D 1/18* (2013.01);
(Continued)

(58) Field of Classification Search
CPC ............. H01L 21/02628; H01L 21/428; H01L 21/02601; H01L 21/02568; H01L 21/477; B05D 1/18; B05D 1/005
(Continued)

(56) References Cited

U.S. PATENT DOCUMENTS 9,478,684 B2 * 10/2016 Lee ...................... H01L 31/0326
9,634,161 B2 *  4/2017 Radu ...................... H01L 31/032
(Continued)

OTHER PUBLICATIONS

International Search Report and Written Opinion for International Application No. PCT/US2015/049507 dated Dec. 21, 2015, 13 pages.
(Continued)

*Primary Examiner* — Anthony Ho
*Assistant Examiner* — Mohammad M Hoque
(74) *Attorney, Agent, or Firm* — Foley & Lardner LLP; Cliff Z. Liu

(57) ABSTRACT

A method of forming a thin film includes: (1) providing an ink composition including nanoplates of a layered material disposed in a liquid dispersion medium; (2) applying the ink composition over a substrate to form a coating; and (3) annealing the coating to form a thin film of the layered material over the substrate.

22 Claims, 8 Drawing Sheets

(51) Int. Cl.
*B05D 1/00* (2006.01)
*B05D 1/18* (2006.01)
*H01L 21/428* (2006.01)
*H01L 21/477* (2006.01)
*H01L 29/786* (2006.01)

(52) U.S. Cl.
CPC .. *H01L 21/02381* (2013.01); *H01L 21/02488* (2013.01); *H01L 21/02568* (2013.01); *H01L 21/02601* (2013.01); *H01L 21/428* (2013.01); *H01L 21/477* (2013.01); *H01L 29/78681* (2013.01); *H01L 29/78684* (2013.01)

(58) Field of Classification Search
USPC .......................................................... 438/502
See application file for complete search history.

(56) References Cited

U.S. PATENT DOCUMENTS

| | | | |
|---|---|---|---|
| 2004/0055892 A1 | 3/2004 | Oh et al. | |
| 2007/0090346 A1 | 4/2007 | Jeong et al. | |
| 2007/0092648 A1* | 4/2007 | Duren | C23C 18/1204 427/255.31 |
| 2007/0264488 A1* | 11/2007 | Lee | H01L 31/032 428/323 |
| 2008/0092953 A1* | 4/2008 | Lee | B82Y 10/00 136/261 |
| 2010/0261304 A1* | 10/2010 | Chang | C23C 18/06 438/72 |
| 2011/0097496 A1* | 4/2011 | Mitzi | H01L 21/0237 427/256 |
| 2012/0220066 A1* | 8/2012 | Cao | H01L 21/02568 438/73 |
| 2012/0279565 A1* | 11/2012 | Mitzi | H01L 21/0237 136/256 |
| 2013/0037110 A1* | 2/2013 | Mitzi | H01L 21/02568 136/264 |
| 2013/0037111 A1* | 2/2013 | Mitzi | H01L 31/0326 136/264 |
| 2013/0125988 A1* | 5/2013 | Cao | H01L 31/18 136/264 |
| 2013/0260094 A1* | 10/2013 | Wu | H01B 1/04 428/141 |
| 2013/0316519 A1 | 11/2013 | Mitzi et al. | |
| 2014/0220724 A1* | 8/2014 | Duty | H01L 21/02521 438/69 |
| 2014/0249324 A1* | 9/2014 | Harris | H01L 31/0322 556/28 |
| 2015/0187762 A1* | 7/2015 | Wahl | H01L 27/088 257/9 |
| 2016/0218231 A1* | 7/2016 | Park | H01L 31/0445 |
| 2016/0233358 A1* | 8/2016 | Carroll | C01G 19/006 |

OTHER PUBLICATIONS

Arias, A.C. et al. (2010) "Materials and Applications for Large Area Electronics: Solution-Based Approaches," Chem. Rev. 110(1):3-24.

Cao, Q. et al. (2008) "Medium-scale carbon nanotube thin-film integrated circuits on flexible plastic substrates," Nature 454(7203):495-500.

Duan, X. et al. (2003) "High-performance thin-film transistors using semiconductor nanowires and nanoribbons," Nature 425(6955):274-278.

Hecht, D.S. et al. (2011) "Emerging Transparent Electrodes Based on Thin Films of Carbon Nanotubes, Graphene, and Metallic Nanostructures," Adv. Mater. 23(13):1482-1513.

Hu, L. et al. (2010) "Carbon Nanotube Thin Films: Fabrication, Properties, and Applications," Chem. Rev. 110(10):5790-5844.

Hu, L. et al. (2010) "Scalable Coating and Properties of Transparent, Flexible, Silver Nanowire Electrodes," ACS Nano 4(5):2955-2963.

Huang, Y. et al. (2001) "Directed Assembly of One-Dimensional Nanostructures into Functional Networks," Science 291(5504):630-633.

Lin, Z. et al. (2014) "Solution Processable Colloidal Nanoplates as Building Blocks for High-Performance Electronic Thin Films on Flexible Substrates," Nano Lett. 14(11):6547-6553.

Oh, J.H. et al. (2009) "Solution-processed, high-performance n-channel organic microwire transistors," Proc. Natl. Acad. Sci. USA 106(15):6065-6070.

Ridley, B.A. et al. (1999) "All-Inorganic Field Effect Transistors Fabricated by Printing," Science 286(5440):746-749.

Snow, E.S. et al. (2003) "Random networks of carbon nanotubes as an electronic material," Appl. Phys. Lett. 82(13):2145-2147.

Sun, Y.G. et al. (2007) "Inorganic Semiconductors for Flexible Electronics," Adv. Mater. 19(15):1897-1916.

Talapin, D.V. et al. (2005) "PbSe Nanocrystal Solids for n- and p-Channel Thin Film Field-Effect Transistors," Science 310(5745):86-89.

Talapin, D.V. et al. (2010) "Prospects of Colloidal Nanocrystals for Electronic and Optoelectronic Applications," Chem. Rev. 110(1):389-458.

Thomas, S.R. et al. (2013) "Solution-processable metal oxide semiconductors for thin-film transistor applications," Chem. Soc. Rev. 42(16):6910-6923.

Wang, C. et al. (2013) "Carbon nanotube electronics—moving forward," Chem. Soc. Rev. 42(7):2592-2609.

* cited by examiner

| Materials | Method | Fabrication temp (°C) | σ (S·cm$^{-1}$) | μ (cm$^2$·V$^{-1}$·s$^{-1}$) |
|---|---|---|---|---|
| Bi$_2$Se$_3$ | Solution deposition (H$_2$O) on glass | 60 | 7-36 | N/A |
| | Solution growth (EG) and deposition | 180 /microwave | 5 | N/A |
| | Solution growth (EG) and deposition | 160 | < 10 | N/A |
| | Solution growth (DEG) and deposition | 240/250 (40 MPa) | 433 | < 3 |
| | Chemical bath Deposition | 55/375 | 10$^{-17}$ | N/A |
| | Solution growth (H$_2$O) on Si | 70 | 78 | 30 |
| | Li-intercalation | 220/350 | 180 | N/A |
| | This disclosure | 190/240 | 772±15 | 113±12 |
| | PLD | 350 | 670 | 30 |
| | MOCVD | 450 | 666 | 225 |
| | HPCVD | 375 | 454 | 500 |
| | CVD | 500 | 3000 | N/A |
| | CVD | 700 | 99 | N/A |
| | MBE | 490 | 1700 | 570 |
| ITO | Sol-gel | 200/700 | 52.6 | N/A |
| | Solution growth (ODE) | 295 | 29 | N/A |
| AZO | Microwave (Oleylamine) | 200/950 | 3.5 | 10 |
| Ga-ZnO | Solution growth (Oleylamine) | 310/450 | 67 | 29 |
| Nb-TiO$_2$ | Solution growth (H$_2$O) | 150/1100 | 160 | ~ 5 |
| CNT | Dip and dry | R. T | 125 | N/A |
| | Atomising spray | 100 | 2000 | N/A |
| Pristine graphene | Sonication | R. T | 400 | N/A |
| rGO | Solution/ Thermal annealing | 1100 | 1000 | N/A |
| | Solution/ Thermal annealing | 600 | 250 | N/A |

Figure 5

HIGH PERFORMANCE THIN FILMS FROM SOLUTION PROCESSIBLE TWO-DIMENSIONAL NANOPLATES

CROSS-REFERENCE TO RELATED APPLICATION

This application is a National Stage Entry of International Application No. PCT/US2015/049507, filed Sep. 10, 2015, which claims the benefit of U.S. Provisional Application No. 62/049,961, filed Sep. 12, 2014, the contents of which are incorporated herein by reference in their entirety.

STATEMENT REGARDING FEDERALLY SPONSORED RESEARCH OR DEVELOPMENT

This invention was made with Government support under Grant Number 956171, awarded by the National Science Foundation. The Government has certain rights in the invention.

TECHNICAL FIELD

This disclosure relates to nanoplates and thin films formed from such nanoplates.

BACKGROUND

Plastic substrates have become the preferred substrates for large area electronics and optoelectronics because of their light weight, flexibility, shock resistance and low cost. To this end, the deposition of conducting or semi-conducting thin films on plastic substrates is of importance. For example, a semiconducting thin film (e.g., polycrystalline or amorphous silicon) is a base material for thin film transistors, which are the fundamental building blocks for large area electronics. A transparent conducting thin film (e.g., ITO: indium tin oxide) is a component for diverse optoelectronic devices that simultaneously involve high electrical conductivity and optical transparency, including liquid crystal displays, touch screen, organic light-emitting diodes (OLEDs) and solar cells. Current approaches to these thin films usually involve high temperature chemical vapor deposition (CVD) processes or high vacuum physical vapor deposition (PVD) processes, which are often too costly and often involve too high processing temperature to be compatible with plastic substrates.

For example, indium tin oxide (ITO) is currently the dominant material for transparent conductors and is typically formed by costly PVD approaches. However, the limited natural abundance of indium and the brittle nature of an ITO film pose a potential challenge for its application in future flexible devices. Additionally, ITO shows poor transparency in near-infrared (NIR) region due to free carrier absorption, and thus is unsuitable for infrared imaging, sensing, emission devices, or NIR-sensitive solar cells. On the other hand, CVD grown $Bi_2Se_3$ thin films can function as an excellent infrared transparent conductor. $Bi_2Se_3$ is a layered, narrow-bandgap semiconductor, and also a typical topological insulator with metallic surface state. Theoretical and experimental studies have revealed that conducting surface states in $Bi_2Se_3$ are concentrated within a few quintuple layer thickness (<about 6 nm). Therefore, $Bi_2Se_3$ nanostructures may represent a desirable material for the formation of highly conductive electronic thin films. Additionally, the topological insulator $Bi_2Se_3$ thin films can also exhibit an unusual infrared transparency property due to a forbidden direct photoexcitation within a surface state to make it an excellent NIR transparent conductor for infrared optoelectronics. However, these $Bi_2Se_3$ thin films studied to date are typically obtained by a CVD approach, which involves stringent synthetic conditions including specific substrates (e.g., mica), high temperature and vacuum, which are difficult and costly to scale for large area production on plastic substrates.

It is against this background that a need arose to develop embodiments of this disclosure.

SUMMARY

Low temperature, solution-processed electronic materials on plastic substrates are of considerable interest for flexible electronics. Solution dispersible inorganic nanostructures (e.g., zero-dimensional (0D) quantum dots or one-dimensional (1D) nanowires) have emerged as interesting ink materials for low temperature, solution processing of electronic thin films on flexible substrates, but usually with insufficient performance due to a large number of grain boundaries (0D) or incomplete surface coverage (1D). Here some embodiments are directed to two-dimensional (2D) colloidal nanoplates of layered materials as an ink material for solution assembly of high performance electronic thin films. The 2D colloidal nanoplates exhibit few dangling bonds, and represent a desirable geometry for the formation of highly uniform, substantially continuous thin films with greatly reduced grain boundaries dictated by large area conformal plane-plane contact with atomically flat and clean interfaces. It can therefore provide efficient charge transport across neighboring nanoplates and throughout an entire thin film to provide unprecedented electronic performance. In some embodiments, it is shown that $Bi_2Se_3$ and $Bi_2Te_3$ nanoplates can be synthesized with well-controlled thickness (about 6-15 nm), lateral size (about 0.5-3 μm), and can be used for the formation of highly uniform, substantially continuous thin films with a substantially full surface coverage and an excellent room temperature carrier mobility greater than about 100 $cm^2 \cdot V^{-1} \cdot s^{-1}$, approaching that of CVD grown materials. This disclosure demonstrates a general strategy of using 2D nanoplates as a desirable building block for the formation of high performance electronic thin films on plastic substrates for flexible electronics and optoelectronics.

One aspect of this disclosure relates to a method of forming a thin film. In some embodiments, the method includes: (1) providing an ink composition including nanoplates of a layered material disposed in a liquid dispersion medium; (2) applying the ink composition over a substrate to form a coating; and (3) annealing the coating to form a thin film of the nanoplates over the substrate.

In some embodiments, the layered material is a transition metal chalcogenide or a post-transition metal chalcogenide.

In some embodiments, the layered material is selected from $Bi_2Se_3$, $Bi_2Te_3$, $MoS_2$, $MoSe_2$, $WS_2$, $WSe_2$, $TaS_2$, $TiS_2$, $SnS_2$, and $NbSe_2$.

In some embodiments, the nanoplates have a lateral size of at least about 100 nm, at least about 200 nm, at least about 300 nm, at least about 400 nm, at least about 500 nm, at least about 600 nm, at least about 700 nm, at least about 800 nm, at least about 900 nm, at least about 1 μm, at least about 2 μm, or at least about 3 μm.

In some embodiments, the nanoplates have a thickness of up to about 39 nm, up to about 36 nm, up to about 33 nm, up to about 30 nm, up to about 27 nm, up to about 24 nm, up to about 21 nm, up to about 18 nm, up to about 15 nm, up to about 12 nm, up to about 9 nm, or up to about 6 nm.

In some embodiments, a surface coverage of the substrate by the nanoplates is at least about 70%, at least about 80%, at least about 90%, at least about 95%, at least about 98%, at least about 99%, or at least about 99.5%.

In some embodiments, neighboring ones of the nanoplates in the thin film form plane-to-plane contacts.

In some embodiments, applying the ink composition is via spin-coating, dip-coating, screen printing, or inkjet printing.

In some embodiments, annealing the coating is via thermal annealing at a temperature in the range of about 150° C. to about 400° C., about 150° C. to about 300° C., about 300° C. to about 400° C., or about 240° C. to about 350° C.

In some embodiments, annealing the coating is via laser annealing.

In some embodiments, a carrier mobility of the thin film at 300 K is at least about 20 $cm^2 \cdot V^{-1} \cdot s^{-1}$, at least about 30 $cm^2 \cdot V^{-1} \cdot s^{-1}$, at least about 40 $cm^2 \cdot V^{-1} \cdot s^{-1}$, at least about 50 $cm^2 \cdot V^{-1} \cdot s^{-1}$, at least about 60 $cm^2 \cdot V^{-1} \cdot s^{-1}$, at least about 70 $cm^2 \cdot V^{-1} \cdot s^{-1}$, at least about 80 $cm^2 \cdot V^{-1} \cdot s^{-1}$, at least about 90 $cm^2 \cdot V^{-1} \cdot s^{-1}$, at least about 100 $cm^2 \cdot V^{-1} \cdot s^{-1}$, or at least about 110 $cm^2 \cdot V^{-1} \cdot s^{-1}$.

In some embodiments, a conductivity of the thin film at 300 K is at least about 100 $S \cdot cm^{-1}$, at least about 200 $S \cdot cm^{-1}$, at least about 300 $S \cdot cm^{-1}$, at least about 400 $S \cdot cm^{-1}$, at least about 500 $S \cdot cm^{-1}$, at least about 600 $S \cdot cm^{-1}$, or at least about 700 $S \cdot cm^{-1}$.

Another aspect of this disclosure relates to a method of forming nanoplates. In some embodiments, the method includes: (1) combining a metal-containing precursor, a chalcogenide-containing precursor, a capping agent, and a reducing solvent to form a reaction mixture; and (2) heating the reaction mixture to form nanoplates of a metal chalcogenide.

In some embodiments, the capping agent is poly(vinylpyrrolidone).

In some embodiments, the reducing solvent is a polyol.

In some embodiments, heating the reaction mixture is carried out at a temperature in the range of about 100° C. to about 300° C. or about 150° C. to about 200° C., and for a duration in the range of about 0.4 hr to about 5 hr or about 1 hr to about 4 hr.

In some embodiments, the metal is a transition metal or a post-transition metal.

In some embodiments, the metal is selected from Bi, Mo, W, Ta, Ti, Sn, and Nb, and the chalcogenide is selected from Se, Te, and S.

In some embodiments, the nanoplates have a lateral size of at least about 100 nm, at least about 200 nm, at least about 300 nm, at least about 400 nm, at least about 500 nm, at least about 600 nm, at least about 700 nm, at least about 800 nm, at least about 900 nm, at least about 1 μm, at least about 2 μm, or at least about 3 μm, and have a thickness of up to about 39 nm, up to about 36 nm, up to about 33 nm, up to about 30 nm, up to about 27 nm, up to about 24 nm, up to about 21 nm, up to about 18 nm, up to about 15 nm, up to about 12 nm, up to about 9 nm, or up to about 6 nm.

In some embodiments, the metal chalcogenide is a first metal chalcogenide, and the method further includes performing epitaxial growth of a second metal chalcogenide over the nanoplates, and the second metal chalcogenide is different from the first metal chalcogenide.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings.

FIG. 5. Table setting forth performance of selected $Bi_2Se_3$ thin films, solution-processed transparent conducting oxides and carbon-based transparent conductors.

DETAILED DESCRIPTION

Nanoplates for the Formation of High Performance Thin Films

To reduce the processing temperature for plastic electronics, there is a growing interest in solution dispersible materials, such as in the form of an ink or an ink composition, which can be processed into conducting or semiconducting thin films on plastic substrates using low temperature and low cost approaches such as spin-coating, dip-coating, screen printing, or inkjet printing. To this end, organic semiconductors (or conducting polymers) represent an example of solution processible material for the formation of conducting thin films. These solution processed organic thin films, however, typically exhibit a low charge carrier mobility of less than about 1-10 $cm^2 \cdot V^{-1} \cdot s^{-1}$. Alternatively, solution processible inorganic nanostructures have emerged as a new class of materials that can be processed like organic materials at low temperatures while at the same time retain excellent electrical properties of crystalline inorganic materials for high performance electronic and optoelectronic devices on flexible substrates.

Figure 1:
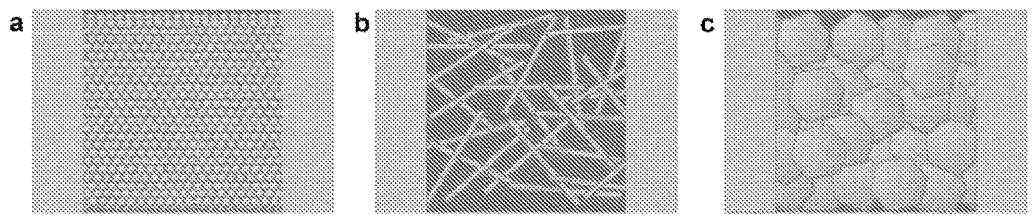
FIG. 1. Schematic illustration for thin films based on 0D (a), 1D (b) and 2D (c) nanostructures.

Zero-dimensional (0D) nanostructures (e.g., quantum dots) and one-dimensional (1D) nanostructures (e.g., nanowires and nanotubes) can be synthesized with nearly perfect crystalline structure. These nanostructures can be dispersed in solution to form a stable and easy-to-handle colloidal ink to allow solution processing of conducting thin films. An example of an inorganic colloidal ink is one based on quantum dot materials, which can form thermodynamically stable colloidal solutions, and can be processed into thin film materials on diverse substrates through a spin-coating or dip-coating process. Although an electrical performance (e.g., a carrier mobility) of the resulting films is generally better than that of organic thin films, it is however still constrained by severe scattering from a very large number of grain boundaries within the quantum dots thin films due to the nanoscale grain size (FIG. 1a). Using 1D nanowire- or nanotube-based ink can greatly reduce the number of grain boundaries between source-drain electrodes. However, thin films obtained from these 1D nanostructures usually have a reduced surface coverage with constrained current delivering ability and can involve sophisticated assembly approaches to optimize the surface coverage for desired delivering current (FIG. 1b).

Some embodiments of this disclosure are directed to the use of two-dimensional (2D) nanoplates in a colloidal ink for the formation of high performance electronic thin films for flexible electronics and optoelectronics. 2D nanoplates represent a desirable geometry for the formation of substantially continuous thin films with substantially 100% surface coverage and at the same time greatly reduced grain boundaries to provide high performance solution processible electronic thin films (FIG. 1c). To demonstrate the benefits of 2D colloidal nanomaterials as thin film materials, some embodiments are directed to the solution-phase synthesis and assembly of topological insulator $Bi_2Se_3$ and $Bi_2Te_3$ nanoplates to form high performance electronic thin films on versatile substrates, including silicon, glass and plastic. It is shown that $Bi_2Se_3$ (and $Bi_2Te_3$) nanoplates can be synthesized with a controlled thickness down to a single unit cell to form a stable colloidal solution, and used for the formation of highly conductive thin films with a conductivity of about 772 $S \cdot cm^{-1}$ or more and a carrier mobility of about 113 $cm^2 \cdot V^{-1} \cdot s^{-1}$ or more. The conductivity and mobility of the films of some embodiments are believed to be the highest among reported values for solution-processed $Bi_2Se_3$ thin films (including those from chemical bath deposition and nanocrystal in solution) and are comparable to best reported values for vacuum-deposited thin films due to an unusual 2D geometry effect, namely, large lateral crystalline width and thus few lateral grain boundaries. Of note, a $Bi_2Se_3$ nanoplate thin film can be readily fabricated onto plastic substrates with excellent flexibility. This disclosure presents a demonstration of using solution-phase synthesized colloidal nanoplates for the formation of high performance conducting thin films on flexible substrates.

Layered $Bi_2Se_3$ has a rhombohedral crystal structure in the space group of (R-3 m) with a large unit cell (about 3 nm along c axis) composed of 15 layers of atoms which are divided into 3 quintuple layers. $Bi_2Se_3$ nanoplates were grown in an ethylene glycol (EG) solution using poly (vinylpyrrolidone) (PVP) as a surfactant or capping agent. Note that ethylene glycol and PVP, unlike oleylamine and oleic acid, typically do not form a close-packed layer on a surface which usually inhibits an electron transfer between the nanoplates that can undermine the performance of the resulting electronic devices. The clean solvent and less compact surfactant are important for stronger interaction and more facile charge transfer between nanoplates and therefore ensure the excellent electronic properties of formed thin films. Other capping agents and reducing solvents can be used, including other amide-containing capping agents, and other polyols such as diols or glycols (e.g., diethylene glycol, triethylene glycol, polyethylene glycol, 1,2-propylene glycol, 1,4-butanediol, 1,2-butanediol, 1,3-propylene glycol, germinal diol, octane-1,8-diol, p-menthane-3,8-diol, and 1,5-pentanediol), glycerin, glycerol, glucose, or any combination thereof.

Figure 2:
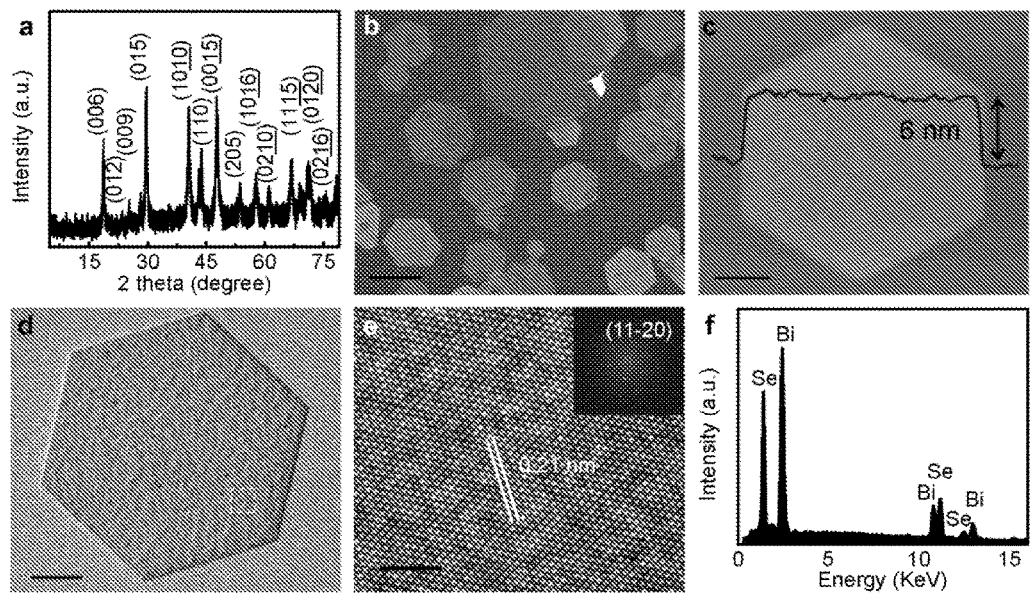
FIG. 2. Characterization of $Bi_2Se_3$ nanoplates. (a) Powder X-ray diffraction (XRD) pattern of about 6 nm thick $Bi_2Se_3$ nanoplates. (b) Typical scanning electron microscope (SEM) image of the about 6 nm thick $Bi_2Se_3$ nanoplates. Scale bar, 1 μm. (c) Atomic force microscope (AFM) image of an individual $Bi_2Se_3$ nanoplate. Scale bar, 300 nm. (d) Typical transmission electron microscope (TEM) image of an about 6 nm thick $Bi_2Se_3$ nanoplate. Scale bar, 300 nm. (e) Corresponding high-resolution TEM (HRTEM) image for a part highlighted by a yellow square in (d). Scale bar, 2 nm. Inset is a Fast Fourier Transform (FFT) of the HRTEM image. (f) Energy dispersive spectroscopy (EDS) result of $Bi_2Se_3$ nanoplates obtained under a SEM.

A powder X-ray diffraction (XRD) pattern of an as-synthesized sample shows a substantially pure phase of rhombohedral $Bi_2Se_3$ (FIG. 2a). The morphology and structure of the as-synthesized $Bi_2Se_3$ nanoplates were further characterized using a scanning electron microscope (SEM) (FIG. 2b), an atomic force microscope (AFM) (FIG. 2c) and a transmission electron microscope (TEM) (FIG. 2d, e). A majority of the nanoplates display a hexagonal geometry, with lateral sizes in the range of about 0.5-3 μm (FIG. 2b). AFM studies show that most of the nanoplates have substantially the same thickness of about 6 nm (FIG. 2c), which is the approximate length of 2 unit cells along the c axis. A small portion of the nanoplates have a smaller thickness of about 3 nm, which corresponds to a single unit cell. The high resolution TEM image (FIG. 2e) shows an atomically resolved lattice spacing of about 0.21 nm, corresponding to the (11-20) lattice plane. Electron diffraction (or Fast Fourier Transform (FFT) of the high resolution image) can be indexed as the [0001] zone axis, demonstrating that the upper/bottom surface is the (0001) plane. Energy dispersive spectroscopy (EDS) results also confirm the existence of Bi and Se in the sample with approximate atomic ratio of 2 to 3 (FIG. 2f).

More generally, nanoplates of a layered material, such as a transitional metal or post-transition metal chalcogenide, can have a lateral size of at least about 100 nm, at least about 200 nm, at least about 300 nm, at least about 400 nm, at least about 500 nm, at least about 600 nm, at least about 700 nm, at least about 800 nm, at least about 900 nm, at least about 1 μm, at least about 2 μm, or at least about 3 μm, and up to about 5 μm or more, or up to about 10 μm or more, and can have a thickness of up to about 39 nm, up to about 36 nm, up to about 33 nm, up to about 30 nm, up to about 27 nm, up to about 24 nm, up to about 21 nm, up to about 18 nm, up to about 15 nm, up to about 12 nm, up to about 9 nm, or up to about 6 nm, and down to about 3 nm or less, and can have an aspect ratio (a lateral size to thickness ratio) that is at least about 10, at least about 50, at least about 100, at least about 200, at least about 300, at least about 400, or at least about 500, and up to about 1000 or more. A ratio of orthogonal lateral dimensions of a nanoplate can be in the range of about 1:10 to about 10:1, about 1:5 to about 5:1, about 1:3 to about 3:1, about 1:2 to about 2:1, or about 1:1.5 to about 1.5:1.

The solution-phase synthesized $Bi_2Se_3$ nanoplates can be thoroughly washed to remove excess capping agent and dispersed in isopropanol to form a stable colloidal solution. Using the colloidal $Bi_2Se_3$ nanoplates ink, a substantially uniform thin film of $Bi_2Se_3$ can be readily prepared on a standard 4-inch $Si/SiO_2$ substrate using a spin-coating process. Unlike the CVD-grown counterparts, the solution-processed film can be readily formed at large scales. Due to the relatively large lateral size and ultra-small thickness, the spin-coating deposited thin films show excellent uniformity with a mirror-like surface (FIG. 3a). To thoroughly remove the solvent residue and enhance the interaction between nanoplates, the spin-coated $Bi_2Se_3$ nanoplate thin film was treated with about 240-350° C. thermal annealing or a rapid laser annealing process (see experimental section in Example). A SEM image of the resulting nanoplate thin film shows that the hexagonal nanoplates overlap with each other evenly to form a substantially continuous thin film (FIG. 3b), which is also confirmed by a cross-sectional SEM image (FIG. 3c). A XRD pattern of the film shows that all major diffraction peaks can be indexed to (0001) family planes for rhombohedral $Bi_2Se_3$ crystals (FIG. 3d). Compared with the XRD pattern for the $Bi_2Se_3$ powder (FIG. 2a) and other reported results, the sole observation of (0001) peaks indicates that the nanoplates preferentially lie on the substrate with substantially the same orientation facing upwards when spin-coated onto the substrate. Due to the large lateral size and small thickness, the large but thin nanoplates typically cannot stand vertically on the substrate, and do not significantly tilt when carefully handled. As a result, solely or primarily the lateral planes, namely (0001), can contribute to the XRD pattern. Together, these results demonstrate that $Bi_2Se_3$ nanoplates can be assembled into a highly uniform thin film with a strong preference in orientation over a large area substrate using a spin-coating process.

More generally, a surface coverage of an area of a substrate by nanoplates can be at least about 70%, at least about 80%, at least about 90%, at least about 95%, at least about 98%, at least about 99%, or at least about 99.5%, and orientations of the nanoplates (e.g., in a direction orthogonal to the (0001) plane) can vary by less than or equal to ±20°, less than or equal to ±15°, less than or equal to ±10°, less than or equal to ±5°, less than or equal to ±4°, less than or equal to ±3°, less than or equal to ±2°, or less than or equal to ±1°, relative to an orientation orthogonal to the area of the substrate.

Figure 3:
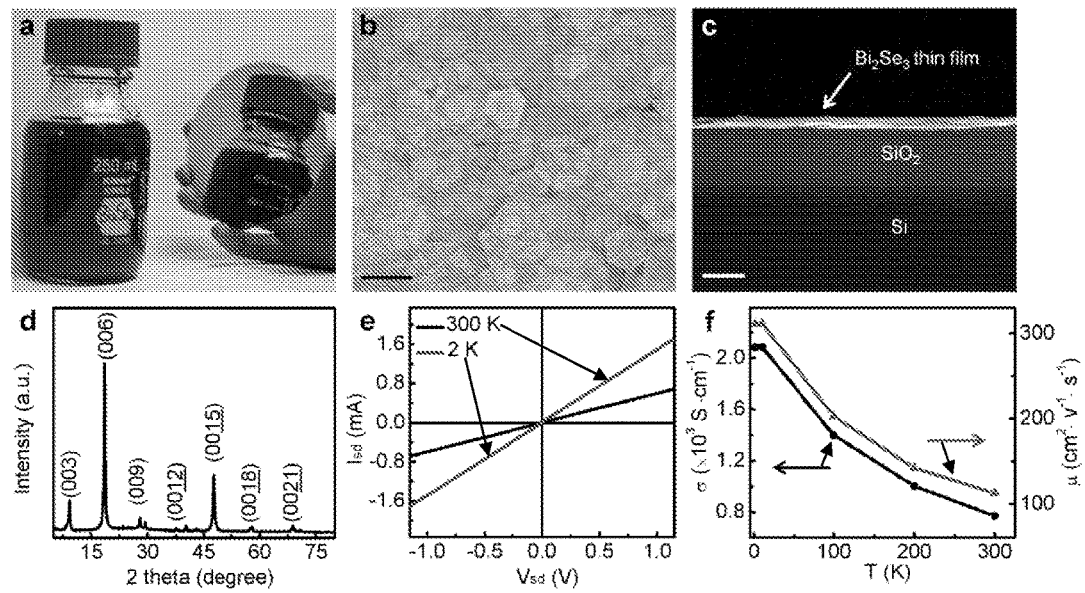
FIG. 3. Performance of a highly uniform $Bi_2Se_3$ nanoplate thin film. (a) Photograph for a colloidal $Bi_2Se_3$ nanoplate ink and nanoplate thin film spin-coated on a standard 4-inch $SiO_2/Si$ wafer with mirror-like surface. (b) SEM image of the $Bi_2Se_3$ nanoplate thin film. Scale bar, 1 μm. (c) SEM image of a cross-section of the $Bi_2Se_3$ nanoplate thin film. Scale bar, 200 nm. (d) XRD pattern for the highly uniform $Bi_2Se_3$ nanoplate thin film. (e) $I_{ds}$–$V_{gs}$ curve for a device including a $Bi_2Se_3$ thin film at about 300 K and about 2 K, respectively. Geometry for the device is length/width (L/W) =about 1:5. (f) Temperature dependence of mobility and conductivity of the $Bi_2Se_3$ nanoplate thin film in the range from about 2 K to about 300 K.
Figure 4:
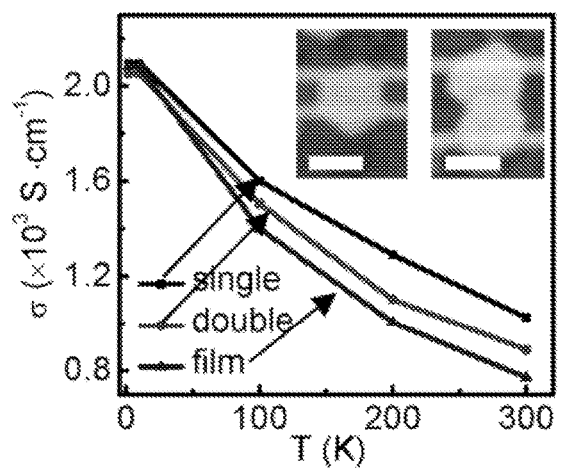
FIG. 4. Temperature dependence of conductivity for single-, double-$Bi_2Se_3$ nanoplate devices and a thin film device, in the range of about 2-300 K. Inset are optical microscope images for the single-nanoplate (left) and double-nanoplate (right) devices. The scale bars are 1 μm.

To probe electronic properties of resulting $Bi_2Se_3$ nanoplate thin films, two terminal devices are fabricated with Ti/Au (about 50 nm/about 50 nm) thin film electrodes. Electrical transport measurements show a linear I-V curve (FIG. 3e), indicating an ohmic contact with the Ti/Au electrodes. Temperature-dependent measurements are conducted to determine conductivity and carrier mobility of the $Bi_2Se_3$ nanoplate thin film as a function of temperature (FIG. 3f). The results show that both the conductivity and mobility increase with decreasing temperature in the range of about 300 K to about 2 K, showing a metallic behavior. Temperature-dependent measurements on single-nanoplate and double-nanoplate devices also show highly comparable characteristics, with higher conductivity at lower temperature for all samples (FIG. 4), indicating that electrical properties of thin film are not dominated by grain boundaries, but by the intrinsic electronic properties of the nanoplates themselves. Hall measurements were also used to determine carrier mobility and carrier concentration. Of note, the thin film exhibits an exceptional high carrier mobility of about 113 cm$^2 \cdot$V$^{-1} \cdot$s$^{-1}$ at about 300 K and about 311 cm$^2 \cdot$V$^{-1} \cdot$s$^{-1}$ at about 2 K (FIG. 3$f$), which is surprisingly high as a solution-processed polycrystalline thin film. This is particularly significant considering the relatively high carrier concentration (about 10$^{19}$ cm$^{-3}$). The mobility value achieved here is believed to be the highest among those reported for solution-processed inorganic thin films (typically on the order of 1-10 cm$^2 \cdot$V$^{-1} \cdot$s$^{-1}$ or less). The conductivity of the Bi$_2$Se$_3$ nanoplate thin film is determined to be about 772 S$\cdot$cm$^{-1}$ at about 300 K and about 2083 S$\cdot$cm$^{-1}$ at about 2 K (FIG. 3$f$). These values represent the highest conductivity achieved among those reported for solution-processed Bi$_2$Se$_3$ thin films and are comparable to those of the best reported CVD-grown ones. It is also important to note that the conductivity for the solution-processed Bi$_2$Se$_3$ nanoplate thin film is better than many solution-processed transparent conducting oxide materials, reduced graphene oxide and carbon nanotube films (FIG. 5).

More generally, a carrier mobility of a nanoplate thin film at about 300 K can be at least about 20 cm$^2 \cdot$V$^{-1} \cdot$s$^{-1}$, at least about 30 cm$^2 \cdot$V$^{-1} \cdot$s$^{-1}$, at least about 40 cm$^2 \cdot$V$^{-1} \cdot$s$^{-1}$, at least about 50 cm$^2 \cdot$V$^{-1} \cdot$s$^{-1}$, at least about 60 cm$^2 \cdot$V$^{-1} \cdot$s$^{-1}$, at least about 70 cm$^2 \cdot$V$^{-1} \cdot$s$^{-1}$, at least about 80 cm$^2 \cdot$V$^{-1} \cdot$s$^{-1}$, at least about 90 cm$^2 \cdot$V$^{-1} \cdot$s$^{-1}$, at least about 100 cm$^2 \cdot$V$^{-1} \cdot$s$^{-1}$, or at least about 110 cm$^2 \cdot$V$^{-1} \cdot$s$^{-1}$, and up to about 130 cm$^2 \cdot$V$^{-1} \cdot$s$^{-1}$ or more, or up to about 150 cm$^2 \cdot$V$^{-1} \cdot$s$^{-1}$, or more, and a conductivity of the nanoplate thin film at about 300 K can be at least about 100 S$\cdot$cm$^{-1}$, at least about 200 S$\cdot$cm$^{-1}$, at least about 300 S$\cdot$cm$^{-1}$, at least about 400 S$\cdot$cm$^{-1}$, at least about 500 S$\cdot$cm$^{-1}$, at least about 600 S$\cdot$cm$^{-1}$, or at least about 700 S$\cdot$cm$^{-1}$, and up to about 800 S$\cdot$cm$^{-1}$ or more, or up to about 900 S$\cdot$cm$^{-1}$ or more.

Figure 6:
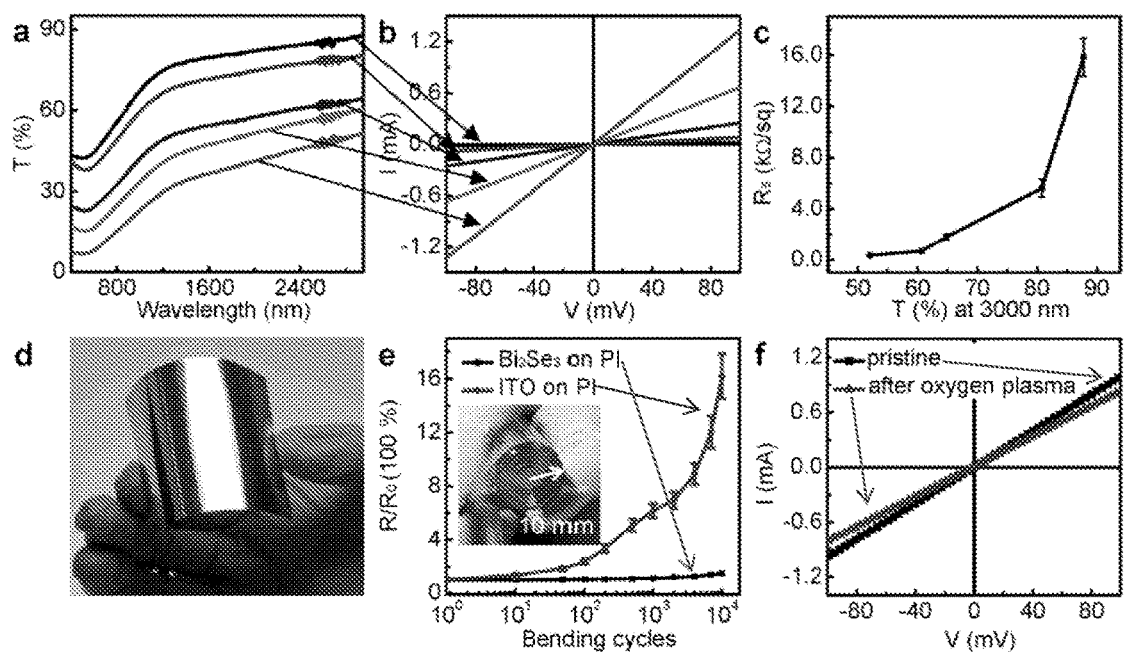
FIG. 6. Characterization of transparency and flexibility of $Bi_2Se_3$ nanoplate thin films. (a) Visible-near-infrared (Vis-NIR) spectrum of the $Bi_2Se_3$ nanoplate thin films with various deposition times and thickness. The lines from top to bottom are for thin films obtained by 2, 4, 7, 9 and 12 times of spin-coating, respectively. (b) Corresponding I-V curves of the $Bi_2Se_3$ nanoplate thin films in (a). Measurement is based on four probe method. (c) Sheet resistance vs. transmittance at 3000 nm relationship for a series of nanoplate thin films with various thickness. (d) Photograph of a $Bi_2Se_3$ nanoplate thin film on polyimide substrate. (e) Relative resistance change in response to bending cycles for the about 60 nm-thick $Bi_2Se_3$ nanoplate thin film and about 60 nm-thick ITO thin film on polyimide substrate. The bending radius is about 10 mm, and the tensile strain is about 0.0025. (f) I-V curves of the nanoplate thin films before and after oxygen plasma treatment (about 90 W, about 30 s).

The superior conductivity allows the use of nanoplates as a colloidal ink for the formation of highly conducting thin films. Bi$_2$Se$_3$ can be highly transparent in the near-infrared (NIR) region (about 1000 nm to about 3000 nm) despite that the photon energy in this region exceeds its band gap energy (about 0.3 eV, about 4000 nm). This is mainly attributed to the ultra-thin topological nature of the Bi$_2$Se$_3$ nanoplates, which forbids direct photoexcitation in topological surface states. Additionally, a free-carrier plasma edge is located in the far-infrared range. A CVD-grown Bi$_2$Se$_3$ thin film has been shown to be a promising candidate for a NIR transparent electrode. Importantly, a solution-processed Bi$_2$Se$_3$ nanoplate thin film can exhibit similar NIR transparency characteristics (FIG. 6$a$). By controlling the number of spin-coating processes, a nanoplate thin film thickness and its transmittance in the infrared range can be controlled. Similarly, a sheet resistance of the corresponding thin films can be determined by transport measurements (FIG. 6$b$). A tradeoff relationship is observed between transmittance and conductance (FIG. 6$c$). The sheet resistance can reach about 340Ω per square with about 52% transmittance (at λ=3000 nm).

With a solution processible ink, Bi$_2$Se$_3$ nanoplates can be readily deposited onto flexible plastic substrates using a spin-coating process (FIG. 6$d$). The flexibility of the ultra-thin nanoplates and their robust topological surface states may preserve electrical conduction under large strain and distortions during mechanical bending to exhibit exceptional flexibility. Of note, the solution processible Bi$_2$Se$_3$ nanoplate thin film exhibits an exceptional flexibility when compared with a traditional ITO film on a flexible plastic substrate. A plot of the thin film resistance as a function of the number of bending cycles (with a radius and strain of about 10 mm and about 0.0025) shows that the resistance of Bi$_2$Se$_3$ nanoplate thin films on polyimide increased by about 10% (from an original value of about 285Ω to about 315Ω) after 1000 bending cycles and by about 48% (to about 423Ω) after about 10000 bending cycles, respectively, while the resistance of sputtered ITO thin films increased by about 518% (from an original value of about 151Ω to about 933Ω) and by about 1519% (to about 2445Ω), respectively (FIG. 6$e$). It should be noted that the surface of a polyimide substrate is sometimes not smooth enough, and electrodes on a film may break which may partly compromise the durability of the film during the bending process. The intrinsic flexibility of the Bi$_2$Se$_3$ nanoplate thin film may be further improved by using a smoother substrate.

In addition, testing was conducted on the effect of oxygen plasma treatment on the films. FIG. 6$f$ demonstrates a typical sheet resistance change from an original value of about 458Ω per square to about 553Ω per square, which increases by about 21%, after direct exposure to a plasma mixture of oxygen/nitrogen (about 1:4) under an input power of about 90 W for about 30 seconds. This compares favorably to a CVD-grown sample with about 33% increase. Unlike a single layer graphene transparent electrode, which can be readily destroyed in oxygen plasma, a Bi$_2$Se$_3$ transparent conductor is much more robust to an extreme environment. The solution assembly of Bi$_2$Se$_3$ nanoplate thin film opens a low temperature, low cost pathway to infrared transparent conducting materials that may find many important applications in diverse infrared optoelectronics including infrared sensing, imaging and emission devices. For example, in a forward-looking infrared (FLIR) system, an infrared transparent conductor can be coated on a surface for defogging, de-icing, de-staticization, and reducing electromagnetic interference while allowing enough infrared light to enter the system.

Figure 7:
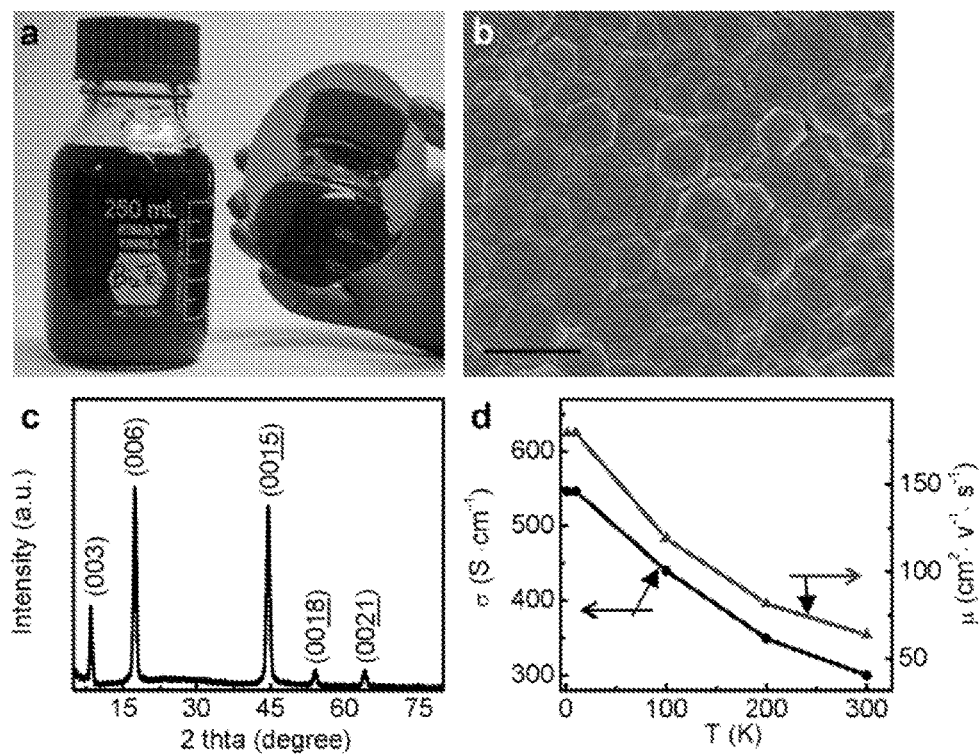
FIG. 7. Characterization of a $Bi_2Te_3$ nanoplate thin film. (a) Photograph of a colloidal $Bi_2Te_3$ nanoplates ink and a nanoplate thin film on a 4-inch $SiO_2/Si$ wafer with mirror-like reflection. (b) Typical SEM image of the $Bi_2Te_3$ nanoplate thin film. Scale bar, 1 μm. (c) XRD pattern of the highly uniform $Bi_2Te_3$ nanoplate thin film with strong orientation preference. (d) Temperature dependence of mobility and conductivity of the $Bi_2Te_3$ nanoplate thin film in the range from about 2 K to about 300 K.

The strategy to use 2D nanoplates ink as building blocks for solution processible electronic thin films is general and can be extended to other materials. For example, Bi$_2$Te$_3$ nanoplates are synthesized and used to form thin films with a similar mirror-like surface (FIG. 7$a$). Bi$_2$Te$_3$ has a similar rhombohedral crystal structure to that of Bi$_2$Se$_3$. A SEM image demonstrates a hexagonal shape with a lateral size of about 700 nm (FIG. 7$b$). A XRD pattern of a thin film shows just the diffraction peaks of (0001) family planes of Bi$_2$Te$_3$ (FIG. 7$c$), indicating the formation of a highly uniform thin film. The thin film of Bi$_2$Te$_3$ nanoplates exhibits a conductivity of about 300 S$\cdot$cm$^{-1}$ and a mobility of about 63.7 cm$^2 \cdot$V$^{-1} \cdot$s$^{-1}$ at about room temperature, which increase to about 546 S$\cdot$cm$^{-1}$ and about 179.8 cm$^2 \cdot$V$^{-1} \cdot$s$^{-1}$ at about 2 K, respectively (FIG. 7$d$). The conductivity and mobility are among the highest numbers achieved in solution-processed Bi$_2$Te$_3$ films.

Thus, this disclosure sets forth the strategy of using colloidal nanoplates as a building block with a 2D geometry for a solution-phase assembly of high performance electronic thin films. With a colloidal Bi$_2$Se$_3$ nanoplate ink, mirror-like thin films can be readily prepared on silicon, glass or plastic substrates over a large scale using a spin-coating process. The resulting nanoplate thin films exhibit excellent electrical conductivity, carrier mobility, NIR transparency and mechanical flexibility that are difficult to achieve with other solution-processed thin film materials.

Figure 8:
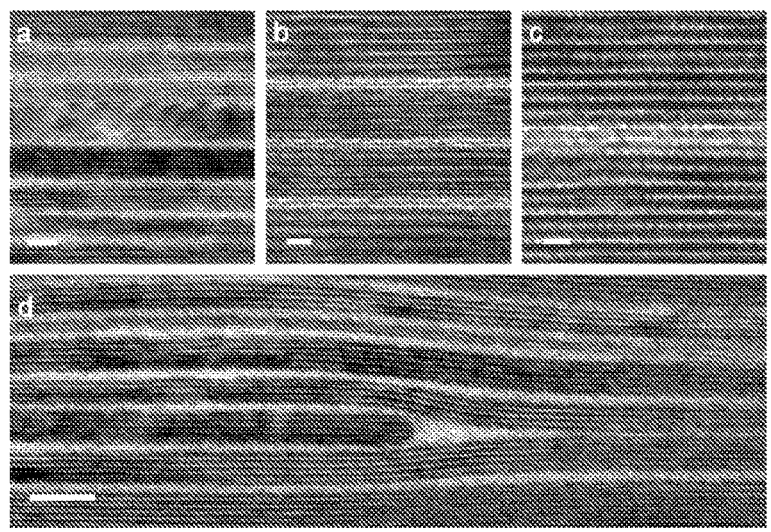
FIG. 8. Cross-sectional TEM characterizations of a $Bi_2Se_3$ nanoplate thin film. (a-c) Cross-sectional TEM images of the $Bi_2Se_3$ nanoplate thin film at different magnifications show atomically flat interfaces between neighboring nanoplates. Scale bars, 5 nm in (a), 2 nm in (b) and 1 nm in (c). (d) Cross-sectional TEM image of the $Bi_2Se_3$ nanoplate thin film near a nanoplate edge show bending of nanoplates across a step edge to ensure conformal face-to-face contact. Scale bar, 10 nm.
Figure 9:
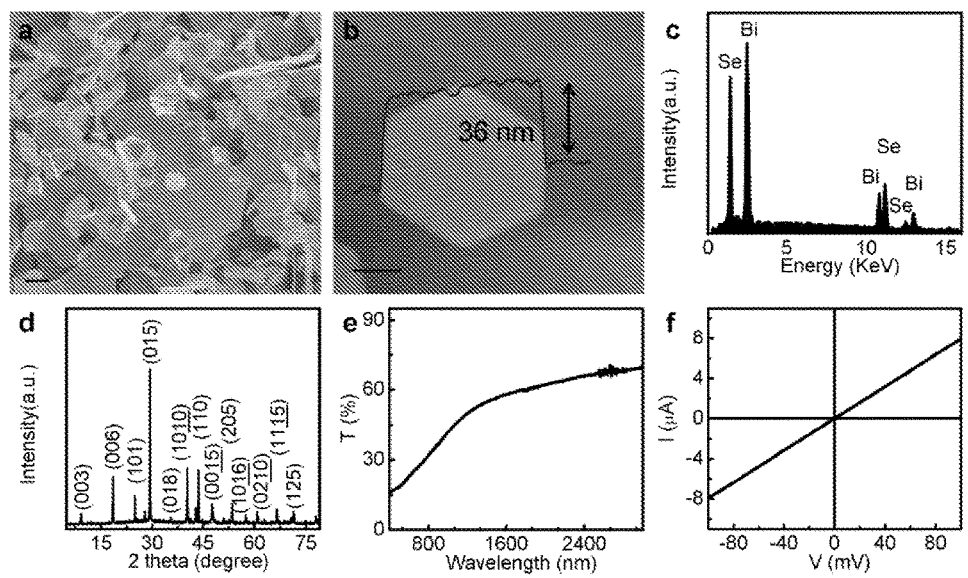
FIG. 9. Characterizations of thick $Bi_2Se_3$ nanoplates. (a) Large area SEM image of the thick $Bi_2Se_3$ nanoplates. Scale bar, 1 μm. (b) AFM image of an individual thick $Bi_2Se_3$ nanoplate. Scale bar, 400 nm. (c) EDS for thick $Bi_2Se_3$ nanoplates. (d) XRD pattern for a thick $Bi_2Se_3$ nanoplate thin film. (e) Vis-NIR spectrum for the thick $Bi_2Se_3$ nanoplate thin film. (f) I-V curve for a device including a thin film based on thick $Bi_2Se_3$ nanoplates. The geometry for the device is L/W=about 1:4.

The excellent conductivity and mobility achieved in nanoplate thin films are attributed to the usual nanoplate geometry. In particular, a large lateral size and a small thickness of the nanoplates is highly beneficial for the formation of highly uniform thin films with excellent electronic properties. With a large aspect ratio (lateral width/thickness), an areal density of grain boundaries within a horizontal plane is greatly reduced by a factor of about $10^4$-$10^5$ when compared with typical quantum dot-based thin films. Additionally, the grain boundaries in the nanoplate thin films are dominated by plane-plane interfaces with a large contact area. Cross-sectional TEM studies show large area plane-plane contacts with nearly atomically flat 2D interfaces between neighboring nanoplates (FIG. 8a-c). The large area plane-plane interfaces are fundamentally different from point contacts within 0D or 1D nanostructure thin films, and can ensure efficient charge transfer across the neighboring nanoplates to provide unprecedented electronic performance. Furthermore, the ultra-thin and highly flexible nature of the 2D nanoplates allows the nanoplates to readily bend across edge steps to make conformal plane-to-plane contact across the nanoplate edge (FIG. 8d), and therefore reduces or minimizes the impact of such edge steps on charge transport and provides the formation of highly uniform nanoplate thin films (FIG. 3b). In contrast, films based on thicker $Bi_2Se_3$ nanoplates show worse uniformity and lower conductivity (FIG. 9), largely because the thicker nanoplates may not be dispersed as well in solution, and may not be sufficiently flexible to form uniform thin films. Therefore, nanoplates with both large lateral size and small thickness are highly desirable for deposition of highly uniform thin films with reduced grain boundary scattering. In this regard, the substantially dangling bond-free 2D $Bi_2Se_3$/$Bi_2Te_3$ nanoplates with topological insulator surface conducting states are particularly relevant since their surface conduction is not measurably affected by a thickness of the material, while a traditional material typically has a surface depletion layer with rather poor conductivity in ultra-thin nanostructures due a large number of dangling bonds and associated defects.

Together, a highly flexible, conformal 2D plane-to-plane contact with nearly atomically flat interfaces can ensure efficient charge transport across neighboring nanoplates and provide unprecedented electronic properties in solution-processed nanoplate thin films. It is noted that the 2D $Bi_2Se_3$ nanoplate ink can offer several significant advantages to ensure high performance electronic thin films at low temperature and low cost. First, the ultra-thin 2D geometry allows the formation of substantially continuous thin films with substantially complete surface coverage and greatly reduced grain boundaries to ensure excellent electronic performance. Second, a solution coating process can avoid high temperature or high vacuum environment, and can therefore allow cost reduction. Third, the solution-processed nanoplate thin film can be readily applied to diverse materials (e.g., $Bi_2Se_3$, $Bi_2Te_3$, and $MoS_2$) and versatile substrates, such as Si/$SiO_2$, glass and plastic substrates. In contrast, a CVD method is usually highly material specific and involves a special substrate, which severely restricts its application. For example, to extend CVD growth onto plastic substrates is particularly challenging. Moreover, the solution coating process can be readily scaled over large-area substrates. Unlike CVD-grown samples of which sizes are bounded by a dimension of a furnace and uniformity of a heating zone or vapor phase reactants, the solution coating process can allow deposition of thin films with nearly any desired size. Other fabrication processes such as roll-to-roll printing are also contemplated for processing of nanoplate thin films over even larger scale that is difficult to achieve for processes involving vacuum deposition. This disclosure therefore provides a pathway to high performance electronic thin films using colloidal nanoplate ink and allows large-area electronics and optoelectronics.

In summary for some embodiments, this disclosure demonstrates the use of 2D colloidal nanoplates as an ink material for the formation of high performance electronic thin films. Ultra-thin $Bi_2Se_3$ and $Bi_2Te_3$ nanoplates can be synthesized with well-controlled thickness (about 6-15 nm) and lateral size (about 0.5-3 μm). These $Bi_2Se_3$ (and $Bi_2Te_3$) 2D nanoplates represent a desirable geometry for the formation of substantially continuous thin films with greatly reduced grain boundaries and a substantially full surface coverage. Additionally, the topological insulator $Bi_2Se_3$ possesses highly conducting surface states concentrated within a few quintuple layer thickness (<about 6 nm) from its surface, and exhibits an unusual infrared transparency property (due to the forbidden direct photoexcitation within the surface states) to render it a desirable material for an ultra-thin NIR transparent conductor. Using $Bi_2Se_3$ nanoplate ink through a spin-coating process, highly uniform mirror-like thin films can be prepared on diverse substrates including silicon, glass and plastics with unprecedented performance, including a room temperature conductivity of about 772 S·cm$^{-1}$, a carrier mobility of about 113 cm$^2$·V$^{-1}$·s$^{-1}$, excellent NIR transparency (e.g., at least about 30%, at least about 40%, at least about 50%, at least about 60%, or at least about 70% across at least a portion of the NIR range) and mechanical flexibility, which are difficult to achieve with other solution-processed thin film materials. This disclosure defines a general strategy to use 2D nanoplates as a building block for the formation of high performance electronic thin films on plastic substrates for flexible electronics and optoelectronics.

Additional Embodiments

More generally, 2D layered materials (2DLMs) are included in a class of layered materials (e.g., transition metal chalcogenides such as $MoS_2$, $NbSe_2$, $WS_2$ and $Bi_2Te_3$, and layered oxide materials), in which constituent layers are weakly bonded by van der Waals (vdW) interactions to form 3D crystals, which can be isolated into single or few-layered nanoplates or nanosheets through mechanical exfoliation or liquid exfoliation processes. These 2D nanoplates typically have well-defined crystalline structures with few dangling bonds at surfaces that traditionally plague typical semiconductor nanostructures. The nanoplates can exhibit excellent electronic properties and exceptional mechanical flexibility. With such diverse 2DLMs, it is possible to access a wide range of properties, such as metallic, semi-metallic, semi-conducting, insulating, topological insulating, superconducting and thermoelectric properties. For example, $MoS_2$ and $WS_2$ exhibit band gaps that can be tuned from indirect to direct band by varying the number of atomic layers. $NbSe_2$ can be superconducting, and $Bi_2Te_3$ represents an example topological insulator (TI) material. Furthermore, different 2DLMs may be integrated together to create heterostructures and superlattices for further complexity and functions. Together, this class of desirable 2D material systems allows for implementation at the limit of single atomic thickness, and has the potential to open up opportunities beyond the reach of other semiconductor materials to provide transformative advances across a wide range of technologies from traditional electronic, magnetic and magneto-optic, optoelectronic, and thermoelectric devices to the emerging fields of topological insulators, spintronic devices and quantum computing. Different layers can be combined, each of which has different characteristics.

Exfoliated flakes of layered materials can be constrained in size. To explore the full potential of 2DLMs involves the development of rational approaches for the growth of 2DLMs over large areas, desirably with scalable, low cost approaches. Although CVD growth of 2DLMs is reported, their growth is usually based on a thermal evaporation approach to vaporize a solid source to create a chemical vapor for subsequent growth. This approach can be difficult to control and scale to large areas. Additionally, the CVD approach typically involves high temperature and is usually incompatible with large area plastic substrates, which may be more desirable for many emerging applications, such as large area flexible electronics. Here some embodiments propose solution chemical synthesis as an alternative strategy for the scalable growth of 2DLMs with unprecedented control of chemical composition, physical dimension (e.g., lateral size and vertical thickness) and heterostructure interfaces. By doing so, it is proposed to create a robust 2DLM material platform for implementation at the limit single atomic thickness. There are two major aspects: (1) deterministic synthesis of 2DLMs and their heterostructures; and (2) large scale assembly of 2DLM thin films for highly flexible electronics and optoelectronics.

Figure 10:
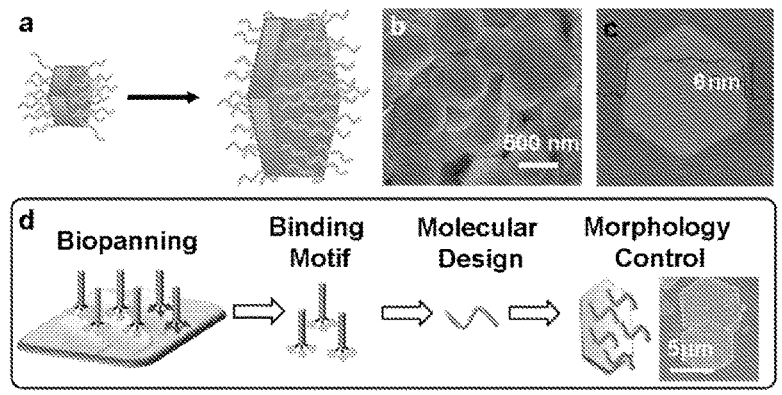
FIG. 10. Kinetically controlled growth of nanoplates of 2D layered materials (2DLMs). (a) Growth of 2DLM nanoplates using surface ligands to modify a surface energy of selected surfaces. (b, c) SEM and AFM images of $Bi_2Se_3$ nanoplates. (d) A molecular evolution approach to identify and design specific surface ligands to regulate 2DLM nanoplate growth.

Deterministic Synthesis of 2DLM Nanoplates and their Heterostructures:

Some embodiments implement a solution chemical synthesis approach for controlling 2DLMs. Crystal nucleation and growth processes in solution can be controlled by introducing certain regulating agents or by modulating the growth conditions. For example, by introducing specific chemical ligands (e.g., surfactants or capping agents) that selectively bind to a certain crystallographic plane, it is possible to modify a surface energy of different crystallographic planes and therefore modify their growth kinetics, allowing precise control of a morphology and facet expression of resulting materials (FIG. 10a). The solution synthesis approach can be used grow 2DLMs (e.g., $Bi_2Se_3$, $Bi_2Te_3$ nanoplates) with thicknesses down to single lattice units by introducing poly(vinylpyrrolidone) (PVP) as surface ligands (FIG. 10b,c). Both a lateral size and a thickness of the nanoplates can be well tuned by properly controlling the ratio of chemical precursors and surface ligands. By tuning a binding strength between the surface ligands and specific crystallographic planes, it is possible to further tune the growth kinetics. A significant advantage of solution-based chemical synthesis is its potential for low cost mass production in technological applications.

A biomimetic evolution approach can be used to select specific surface ligands that selectively bind to a given crystallographic surface using a phage display technique. Based on this technique, highly specific ligands can be identified or designed (in combination with theoretical modeling) to regulate nanocrystal growth with fine control of selectively displayed crystal facets. In addition, by coupling experimental studies and simulation efforts, the origin of ligand regulated crystal growth can be understood at the molecular level, wherein a soft-epitaxy between ligands and crystal facets, and molecular binding configurations on a surface can play important roles. With well-defined atomic structure, the 2D materials represent a desirable material system for exploring the biomimetic molecular evolution approach to identify specific surface ligands (FIG. 10d). In some embodiments, biomimetically selected ligands as well as modeling-guided molecular design can be used to identify highly specific ligands to control nucleation and growth kinetics of 2DLMs. Using the phage display selection technique, it can be identified that amide-rich peptide residues show a high binding affinity to the (0001) plane of $Bi_2Te_3$. Furthermore, by using molecules bearing similar chemical motifs, further stabilization can be attained of (0001) faces to suppress their growth, to greatly increase a lateral size of resulting $Bi_2Te_3$ nanoplates (FIG. 10d).

This approach can be generalized for a wide range of 2DLMs beyond $Bi_2Se_3$ and $Bi_2Te_3$ including $MoS_2$, $MoSe_2$, $WS_2$, $WSe_2$, $TaS_2$, $TiS_2$, $SnS_2$, and $NbSe_2$. In a typical process, a phage library whose end proteins are expressed with 7-mer peptides of about $10^9$ random sequences (M13Ph.D7 from NEB.com) can be placed to interact with a chosen surface through a biopanning process. During the selection process, non-specific binders/clones will be washed away while specific binders will remain on a selected 2DLM surface. The surface specific binders can be collected and amplified for DNA sequencing, which can then be translated into peptide sequences that recognize the selected 2DLM surface. After obtaining the specific sequence, free peptide molecules can be synthesized accordingly using a peptide synthesizer and applied to guide nanoplate formation. For example, in a typical synthesis, 2DLM (e.g., $Bi_2Se_3$) nanoplates can be prepared by simultaneous reduction of selected precursors (e.g., $Bi(NO_3)_3$ and $NaSeO_3$) by using ethylene glycol (EG) as both a solvent and a reducing agent and surface-sensitive peptides as structure-directing capping agent. The solvent used can be varied to render peptides more competitive in binding to 2DLM surfaces. The resulting nanocrystals can be collected by centrifugation and washed prior to structural characterization, elemental mapping and physical studies to examine its shape, composition, surface structures, and functionality. The resulting crystals can be compared with structures produced in a blank control (2DLMs produced without the addition of peptides but with otherwise the same reaction conditions) to delineate effects of specific peptides from synthetic backgrounds. The morphology of the 2DLM nanoplates can be tuned by different binding motifs displayed on the peptides or molecules. To further identify the functional motif encoded in the peptide sequence, a series of engineered peptide molecules with modified conformation or chemical functions, such as by shuffling and replacing selected peptide residues, can be synthesized and used as the capping agents in 2DLM nanoplate synthesis. By examining the structures and elemental distributions in the resulting nanoplates, it can be inferred whether the modifications in the engineered sequences have altered the specific interactions between the engineered peptides and the targeted crystal surface. And by doing so, the key traits/residues in a sequence can be located that dictate a surface specificity. The discovered binding motifs can be incorporated in various peptide molecules as well as small molecules and applied as capping agents in the controlled synthesis of 2DLM nanoplates with designated shapes and surface structures to verify their fidelity in replicating surface recognition. The discovered specific ligand motifs can selectively stabilize (0001) facets and enhance a lateral growth of 2DLM crystals, leading to a large 2D grain size with a controllable thickness suitable for device fabrications.

Figure 11:
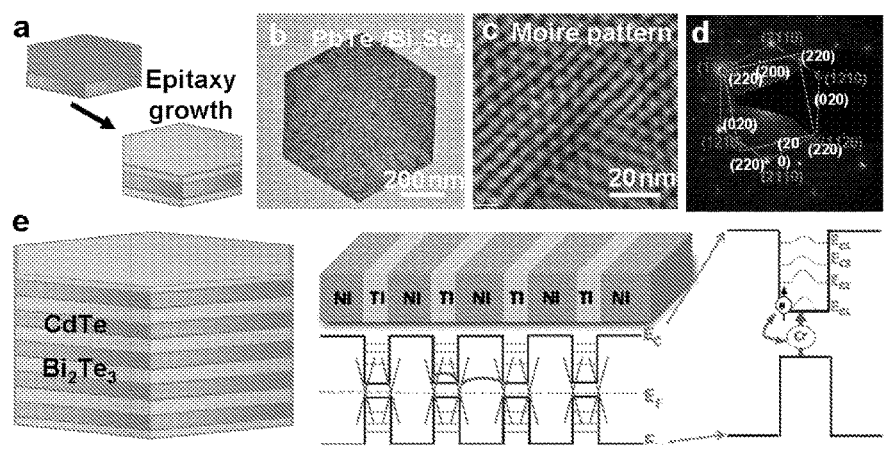
FIG. 11. Deterministic growth of 2DLM nanoplate heterostructures. (a) Templated epitaxial growth of a heterostructure of 2DLMs. (b, c, d) TEM images of $Bi_2Se_3/PbTe$ heterostructures in (b) synthesized through solution epitaxy, with a Moire pattern visible in a HRTEM image in (c), and epitaxial relationship shown by electron diffraction pattern in (d). (e) Vertical stacking of $Bi_2Te_3/CdTe$ heterostructure nanoplates can result in a superlattice structure with alternating topological insulator (TI, $Bi_2Te_3$) and normal insulator (NI, CdTe) layers.

Moreover, using pre-grown nanoplates as nucleation seeds and growth templates, well-defined heterostructures of different 2DLMs can be grown (FIG. 11a). For example, after formation of a $Bi_2Se_3$ nanoplate in solution, a second layer of PbTe can be epitaxially grown on the (0001) plane of the $Bi_2Se_3$ nanoplate by injecting a proper amount of Pb and Te precursors into the system. An epitaxial relationship of PbTe on $Bi_2Se_3$ nanoplates can be confirmed from the appearance of Moire patterns as well as electron diffraction (FIG. 11b-d). With layered $Bi_2Se_3$ as the template, traditionally non-layered symmetry-mismatched materials (e.g., PbTe or PbSe) can be epitaxially grown with fine control over atomic thickness. With such sequential epitaxial growth, multiple growth cycles can be carried out to create superlattices of different 2DLMs. With the great flexibility of solution-based epitaxial growth, different 2DLMs may also be matched and combined together for the growth or assembly of multi-heterostructures and superlattices. For example, vertical stacking of $Bi_2Te_3$/CdTe heterostructure nanoplates can be used to create a superlattice structure with alternating topological insulator (TI, $Bi_2Te_3$) and normal insulator (NI, CdTe) layers, with interactions between top and bottom surface states within one TI layer as well as between adjacent TI layers (FIG. 11e).

Scalable Assembly of 2DLM Nanoplates for Flexible Electronics and Optoelectronics:

Electron transport properties of resulting 2DLMs and heterostructures can be investigated using electron transport spectroscopy. The 2DLMs with well controlled dimensions and heterostructure interfaces provide a 2D material platform at the limit of single atomic layer, and can exhibit exotic low-dimensional phenomena as well as interface effects, for example, related to spin orbit interactions. 2DLM nanoplates and heterostructures can be investigated for electronic, magnetic and related spintronics properties.

The availability of 2DLMs with precisely controlled atomic structure and desired structural, chemical and physical properties allow for developing new technologies in diverse areas including electronics, optoelectronics, bioelectronics, energy conversion as well as spintronics and quantum electronics. In particular, with few-atomic thickness, excellent electronic properties and exceptional mechanical flexibility, the design and integration of different 2DLMs can allow the formation of ultra-flexible electronics, optoelectronics, and quantum electronic devices. With a single or few-atomic thickness and a large surface-to-bulk ratio, the integration of 2DLMs with chemical and biological systems can provide chemical and biological sensors with unprecedented sensitivity for bio-electronic interfacing. Of note, with the development of scalable solution synthesis approaches, a large quantity of 2DLM nanoplates can be readily produced as building blocks for the assembly of large area thin films on flexible substrates for diverse applications.

Assembly of 2DLM Nanoplate Thin Films:

Solution synthesized 2DLM nanoplates can function as a colloid ink for the formation of substantially continuous thin films with substantially 100% surface coverage and with greatly reduced grain boundaries. It can thus allow high performance solution processible electronic thin films on plastics for diverse flexible electronic applications. Using $Bi_2Se_3$ nanoplate ink through a spin-coating process, highly uniform mirror-like thin films can be readily prepared on silicon or plastic substrates with excellent performance including a room temperature carrier mobility greater than about 100 $cm^2 \cdot V^{-1} \cdot s^{-1}$. A small thickness (about 6 nm) of the nanoplates is desirable for the uniform deposition of thin films. Films based on thicker $Bi_2Se_3$ nanoplates (e.g., >about 30 nm) can exhibit worse uniformity and lower conductivity, largely because the thicker nanoplates may not be dispersed as well in solution, and may not be flexible enough to form uniform thin films. This point further highlights the benefits of precisely controlling the dimensions of the nanoplate building blocks. To optimize both the uniformity and transport properties of a film, it is desirable to ensure nanoplates with both a large lateral size and a small thickness to provide uniform thin films with fewer grain boundary scattering.

Beyond $Bi_2Se_3$, it is desirable to use a nanoplate thin film for functional transistors with sufficient on/off ratio based on a band gap and extent of doping of nanoplates. Therefore, it is desirable to precisely control a chemical composition and doping of the nanoplate building blocks. A diverse class of larger band gap 2DLM nanoplates (e.g., $MoS_2$ and $WS_2$) and heterostructures (e.g., $Bi_2Se_3$/CdSe) with controllable dimensions and electronic properties can be used for the formation of high performance thin films with controllable electronic properties.

Figure 12:
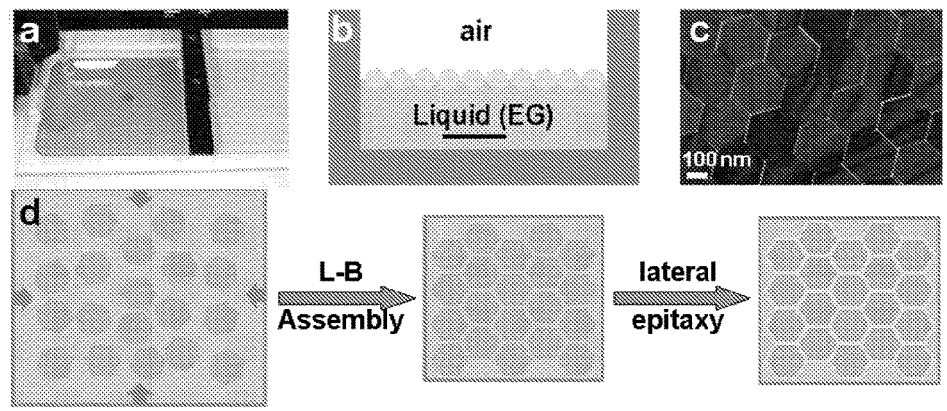
FIG. 12. Assembly of an ordered array of 2DLM nanoplates and lateral epitaxy. A Langmuir-Blodgett assembly in (a), and interfacial assembly of an ordered array of hexagonal nanoplates in (b). (c) An example of an ordered array of $NaYF_4$ nanoplates. (d) Langmuir-Blodgett assembly of an ordered nanoplate thin film and lateral epitaxial growth to merge nanoplates to remove grain boundaries.

Assembly of Ordered Array of 2DLM Nanoplates and Lateral Epitaxial Growth of Nearly Single Crystalline Thin Films:

The assembly of 2DLM nanoplate thin films can greatly reduce grain boundaries for lateral charge transport when compared with typical polycrystalline or quantum dot thin films. To further reduce or even largely eliminate any remaining boundaries in a solution assembled thin film, another assembly process can be used to prepare ordered arrays of hexagonal nanoplates, with the use of a lateral epitaxy approach to chemically merge individual nanoplates into quasi single crystalline thin films (FIG. 12). For example, a Langmuir-Blodgett film approach (FIG. 12a) or interfacial assembly strategy (FIG. 12b) can be used for the formation of substantially continuous and highly uniform nanocrystal superlattice films. In either case, a nanoplate dispersion (e.g., in a mixture of ethanol and chloroform) is drop cast onto an air-liquid (water or ethylene glycol) interface and allowed to slowly evaporate and self-assemble to reach a thermodynamically stable state. With a six-fold symmetry, the hexagonal nanoplates can be expected to self-assemble into close-packed hexagonally ordered arrays to maximize a packing density (FIG. 12c). The particular assembly and ordering can depend on a nanoplate size, aspect ratio, size distribution, amount, and assembly condition. In case of a Langmuir-Blodgett film assembly, a floating nanoplate monolayer on a water surface can be isothermally compressed by moving the barrier across the interface until a desired surface pressure is achieved. By controlling the amount of the nanoplates and the surface pressure, it is also possible to control the formation of monolayer or double layer of nanoplate assembly (FIG. 12d). The self-assembled nanoplate thin film on air-liquid interface can be transferred onto a solid substrate using a dip-coating process. The surface of properties (e.g., hydrophobicity) of the substrate can be controlled (e.g., using self-assembled molecular monolayers) to ensure efficient film transfer. With the formation of the ordered thin film of hexagonal nanoplates, substantially all the nanoplates can be oriented in nearly the same crystallographic orientation. The ordered nanoplate array can be used as seeds for lateral epitaxial growth, which can eventually merge together to form a substantially continuous, nearly single crystalline thin film (FIG. 12d). This lateral epitaxy process can be conducted in solution phase (using a similar process for an initial growth of colloid nanoplates) or in vapor phase (using a CVD system).

Functional Electronics and Optoelectronics Based on 2DLM Thin Films and Heterostructures:

With the formation of high performance thin films, high performance electronic and optoelectronic devices and circuits can be formed. $Bi_2Se_3$ nanoplate thin films can exhibit excellent performance including a room temperature carrier mobility greater than about 100 $cm^2 \cdot V^{-1} \cdot s^{-1}$. Additionally, spin-coated $Bi_2Se_3$ nanoplate thin films on plastic substrates also exhibit an exceptional flexibility when compared to traditional polycrystalline thin films on plastic substrates.

Figure 13:
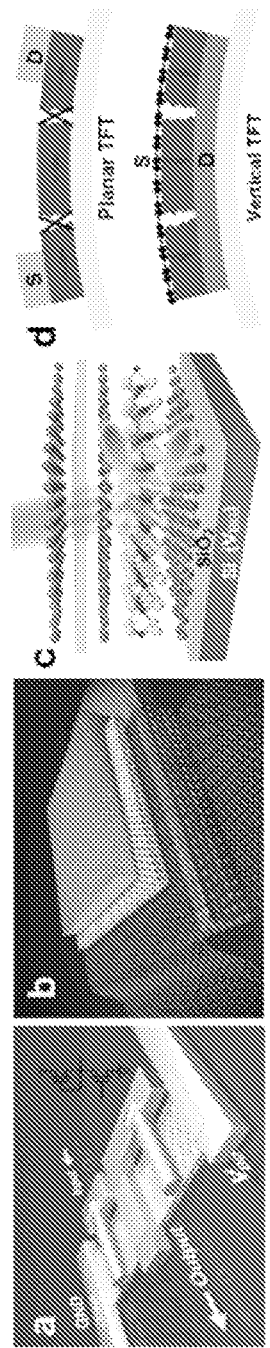
FIG. 13. 2DLM nanoplate thin film for highly flexible electronics and optoelectronics. (a) 2DLM thin film transistors for high speed, low power electronics. Vertical transistors or quantum tunneling devices in (b) and vertical photodiode and photovoltaics devices in (c) based on heterostructures of graphene and 2DLM thin films. (d) Schematic illustration of a planar thin film transistor (TFT) (top) and a vertical TFT (VTFT) (bottom) on flexible substrates. Arrows indicate current flow across channel, which can be severely degraded by cracks in the planar TFT, but not significantly affected in the VTFT, to provide ultra-flexible electronics with unprecedented electrical performance (ultra-short channel length determined by a thin film thickness) or mechanical flexibility (exceptional tolerance of a vertical current flow to the in-plane crack).

The superior electronic properties of a solution assembled $Bi_2Se_3$ nanoplate thin film can be attributed to the desired geometry of the nanoplates. Compared with traditional polycrystalline or quantum dot thin films, the number of grain boundaries across a conducting channel in the nanoplate thin film is greatly reduced. These results demonstrate the benefits of 2D nanoplates as building blocks for highly flexible electronics. In some embodiments, nanoplate thin films can be prepared from materials of a larger band gap (e.g., $MoS_2$ and $WS_2$) for highly flexible thin film transistors. Additionally, 2DLM nanoplate heterostructures with modulated doping can be used to create atomically thin semiconductors with ultra-high carrier mobility for high speed and low power transistors (FIG. 13a).

The formation of 2DLM thin films and heterostructure thin films can also yield devices with attributes not observed in conventional electronics. For example, a graphene-$MoS_2$-metal vertical heterostructure can be used to form a vertical field-effect transistor (VFETs) (FIG. 13b). Furthermore, a graphene-$MoS_2$-graphene vertical heterostructure can function as a broad area photodiode for highly efficient photon harvesting and photocurrent generation (FIG. 13c). Unlike conventional photodiodes in which photocarrier generation and separation is dictated by an intrinsic built-in potential, an amplitude and a polarity of a photocurrent in such vertical heterostructures can be readily modulated by an external gate field to greatly enhance a photoresponse and a quantum efficiency. This heterostructure can allow the design of photodetection and photovoltaic devices, in which an external gate field can be used to greatly accelerate charge separation and transport. In some embodiments, heterostructures between large area graphene and large area nanoplate thin film can be tuned for scalable fabrication of vertical transistors, photodetection and photovoltaic devices. For example, by replacing exfoliated $MoS_2$ flakes with substantially continuous nanoplate thin films, vertical thin-film transistors (VTFTs) can be formed. The concept of VTFTs can offer several combined advantages not readily observed in conventional planar TFTs (FIG. 13d). First, a channel length of such VTFTs is determined by a thickness of a nanoplate thin film rather than by lithography. It can therefore allow an ultra-short channel transistor to afford a delivering current greatly exceeding that of conventional planar TFTs. Second, a vertical (out-of-plane) charge transport across a large area vertical junction renders a source-drain current much less affected by in-plane cracks in semiconductor thin films to afford unprecedented tolerance to in-plane cracks. It can therefore simultaneously address two challenges (low delivering current and insufficient mechanical flexibility) of conventional planar inorganic TFTs to provide highly flexible electronics with exceptional electrical performance and mechanical robustness. For example, an electronic or optoelectronic device can be formed by: (1) providing a substrate; and (2) forming vertically stacked layers over the substrate and including (a) a source electrode; (b) a drain electrode; and (c) a semiconducting channel disposed between the source electrode and the drain electrode. The semiconducting channel can be a thin film formed of nanoplates as described herein.

Also, $Bi_2Se_3$ can be highly transparent in the NIR region (about 1000 nm to about 3000 nm) despite that a photon energy in this region exceeds a band gap energy (about 0.3 eV or about 3000 nm). This is mainly attributed to the ultra-thin topological nature of $Bi_2Se_3$ nanoplates, which forbids direct photoexcitation in topological surface states. Additionally, a free-carrier plasma edge is located in the far-infrared frequency. The solution-processed $Bi_2Se_3$ or $Bi_2Te_3$ nanoplate thin films can be implemented for NIR transparency applications.

The 2DLM material platform can find use in diverse areas including electronics, optoelectronics, bioelectronics, energy conversion as well as spintronics and quantum electronics. In particular, the scalable assembly of high performance 2DLM thin films on plastics can provide a pathway to flexible electronics and optoelectronics. The creation of TI/non-TI/TI heterostructures and superlattices can open up opportunities for highly efficient thermoelectrics (e.g., though Coulomb drag effect of topological excitons).

EXAMPLE

The following example describes specific aspects of some embodiments of this disclosure to illustrate and provide a description for those of ordinary skill in the art. The example should not be construed as limiting this disclosure, as the example merely provides specific methodology useful in understanding and practicing some embodiments of this disclosure.

Experimental Details

Chemicals:
Bismuth nitrate pentahydrate ($Bi(NO_3)_3.5H_2O$, >99.9%), Sodium selenite ($NaSeO_3$, >99%), Sodium tellurite ($NaTeO_3$, >99.5%), Sodium hydroxide (NaOH, >99%), Poly (vinylpyrrolidone) (PVP, MW of about 40,000) and Ethylene glycol (EG) were all purchased from Sigma-Aldrich. All chemicals were used as received without further purification.

Synthesis of Bismuth Selenide Nanoplates:
For about 6 nm-thick nanoplates, about 0.2 mmol $Bi(NO_3)_3.5H_2O$ (about 0.0970 g), about 0.3 mmol $NaSeO_3$ (about 0.0519 g) and about 2 mmol PVP (about 0.2223 g) were dissolved in about 10 mL ethylene glycol. Other suitable metal-containing precursors (e.g., other metal-containing salts), chalcogenide-containing precursors (e.g., other chalcogenide-containing salts), and reducing solvents can be used. The mixture was stirred for about 10 min and then heated to about 190° C. (in about 12 min) in a 25 mL three-neck flask equipped with a thermocouple and reflux condenser in a heating mantle. After about 2.5 hr, the heating mantle was removed, and the mixture was allowed to cool down to room temperature naturally. More generally, heating can be carried out at a temperature in the range of about 100° C. to about 300° C. or about 150° C. to about 200° C. and for a duration in the range of about 0.4 hr to about 5 hr or about 1 hr to about 4 hr. The mixture was then centrifuged at about 10 K rpm for about 8 min after the addition of about 20 mL isopropanol and about 10 mL acetone. The supernatant was discarded, and the solid was dispersed in another about 40 mL isopropanol. The washing steps were repeated with isopropanol for two more times. The final product was dispersed in isopropanol for further characterization. The synthesis of thicker bismuth selenide nanoplates was similar to the 6 nm-thick-nanoplates except that none or a very small amount (<about 0.1 mmol) PVP was added to the mixture. The reaction temperature and washing procedure were the same.

Synthesis of Bismuth Telluride Nanoplates:
About 0.2 mmol $Bi(NO_3)_3.5H_2O$ (about 0.0970 g), about 0.3 mmol $NaTeO_3$ (about 0.0665 g), about 4 mmol NaOH (about 0.1600 g) and about 2 mmol PVP (about 0.2223 g) were dissolved in about 10 mL ethylene glycol. Other suitable metal-containing precursors, chalcogenide-containing precursors, and reducing solvents can be used. The mixture was stirred for about 10 min and then heated to about 190° C. in a 25 mL three-neck flask equipped with a thermocouple and reflux condenser in a heating mantle. After about 3 hr, the heating mantle was removed, and the mixture was allowed to cool down to room temperature naturally. The washing procedure was similar to that of $Bi_2Se_3$ nanoplates. More generally, heating can be carried out at a temperature in the range of about 100° C. to about 300° C. or about 150° C. to about 200° C. and for a duration in the range of about 0.4 hr to about 5 hr or about 1 hr to about 4 hr.

Deposition of Thin Film and Post-Treatment:

The dispersion of $Bi_2Se_3$ or $Bi_2Te_3$ in isopropanol was centrifuged at about 3 K rpm for about 3 min. Other liquid dispersion media can be used, such as other organic solvents including polar protic and polar aprotic organic solvents. The upper dispersion was carefully taken out with a pipette, and the bottom precipitated solid was discarded. This operation, which can remove the aggregated nanocrystals, is desirable to obtain a high quality thin film. The dispersion was spin-coated onto an oxygen-plasma-treated $SiO_2$/Si substrate (about 300 nm in thickness), glass slide or polyimide substrate (about 90 W, about 8 min) at a speed of about 2000 rpm. To obtain thicker films, multiple spin-coating processes were repeated. For the post deposition thermal treatment, the films were typically annealed on a hot plate inside of an argon-filled glove box at about 350° C. for about 30 min. With an about 45° C. isopropanol soak process prior to the thermal treatment, an alternative lower temperature (about 240° C., about 6 hrs) annealing process was also developed to produce nanoplate thin films with essentially the same electrical performance. The lower temperature annealing can allow more choices for plastic substrates besides polyimide. More generally, thermal annealing can be carried out at a temperature in the range of about 150° C. to about 400° C., about 150° C. to about 300° C., about 300° C. to about 400° C., or about 240° C. to about 350° C.

Furthermore, a rapid laser annealing process was developed as an example of other potential annealing methods. By raster scanning a defocused laser beam (about 785 nm, about 12 mW, about 10 μm spot size and about 0.1 second exposure time), essentially the same conductance can be achieved as those obtained by a thermal annealing process. Of note, with its unusual infrared transmission and visible absorption properties, a visible laser can be largely absorbed by the $Bi_2Se_3$ nanoplate thin film and transmitted through a transparent poly(ethylene terephthalate) (PET) substrate. Along with the rapid laser annealing process, it can allow a more localized heating of the $Bi_2Se_3$ nanoplate thin film without increasing the substrate temperature beyond its melting point.

Device Fabrication:

For a Hall effect measurement, small square Ti/Au (about 50 nm/about 50 nm) electrodes were deposited onto corners of a film with a mask using an electron-beam evaporator. For a transport property measurement on a single nanoplate, electron-beam lithography followed by electron-beam evaporation of metal electrodes were performed. For sheet resistance, small round Ti/Au (about 50 nm/about 50 nm) dot-like electrodes were deposited onto thin films using a shadow mask with electron-beam evaporator. The sheet resistance were measured using a four-probe method.

Characterization:

Characterizations were carried out using a scanning electron microscope (SEM, JEOL JSM-6700F FE-SEM) with energy dispersive spectroscopy (EDAX), a transmission electron microscope (TEM, T12 Quick CryoEM and CryoET FEI; acceleration voltage, 120 KV. Titan S/TEM FEI; acceleration voltage, 300 KV), X-ray diffraction (XRD, Panalytical X'Pert Pro X-ray Powder Diffractometer), an atomic force microscope (AFM, Bruker Dimension 5000 Scanning Probe Microscope), and UV-Vis-NIR spectroscopy (Shimadzu 3100 PC). A cross-sectional sample was prepared by cutting a film on a $SiO_2$/Si substrate using focused ion beam (FIB). The Hall measurements were performed in a PPMS (Quantum Design). Other transport characteristics measurements were conducted with a probe station and a computer-controlled analog-to-digital converter at room temperature.

As used herein, the singular terms "a," "an," and "the" include plural referents unless the context clearly dictates otherwise. Thus, for example, reference to an object can include multiple objects unless the context clearly dictates otherwise.

As used herein, the term "set" refers to a collection of one or more objects. Thus, for example, a set of objects can include a single object or multiple objects.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, the term "size" refers to a characteristic dimension of an object. Thus, for example, a size of an object that is circular can refer to a diameter of the object. In the case of an object that is non-circular, a size of the non-circular object can refer to a diameter of a corresponding circular object, where the corresponding circular object exhibits or has a particular set of derivable or measurable characteristics that are substantially the same as those of the non-circular object. Alternatively, or in conjunction, a size of a non-circular object can refer to an average of various orthogonal dimensions of the object. Thus, for example, a size of an object that is an ellipse can refer to an average of a major axis and a minor axis of the object. When referring to a set of objects as having a particular size, it is contemplated that the objects can have a distribution of sizes around the particular size. Thus, as used herein, a size of a set of objects can refer to a typical size of a distribution of sizes, such as an average size, a median size, or a peak size.

As used herein, the term "transition metal" refers to an element in Group 3, 4, 5, 6, 7, 8, 9, 10, 11, or 12 of the Periodic Table. Examples of transition metals include molybdenum (Mo), tungsten (W), tantalum (Ta), titanium (Ti) and niobium (Nb).

As used herein, the term "post-transition metal" refers to aluminum (Al), gallium (Ga), indium (In), tin (Sn), thallium (Tl), lead (Pb), bismuth (Bi), polonium (Po), or flerovium (Fl).

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, operation or operations, to the objective, spirit and scope of the disclosure. All such modifications are intended to be within the scope of the claims appended hereto. In particular, while certain methods may have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations is not a limitation of the disclosure.

What is claimed is:

1. A method of forming a thin film, comprising:
providing an ink composition including nanoplates of a layered material disposed in a liquid dispersion medium;
applying the ink composition over a substrate to form a coating; and
annealing the coating to form a thin film of the layered material over the substrate.

2. The method of claim 1, wherein the layered material is a transition metal chalcogenide or a post-transition metal chalcogenide.

3. The method of claim 1, wherein the layered material is selected from $Bi_2Se_3$, $Bi_2Te_3$, $MoS_2$, $MoSe_2$, $WS_2$, $WSe_2$, $TaS_2$, $TiS_2$, $SnS_2$, and $NbSe_2$.

4. The method of claim 1, wherein the nanoplates have a lateral dimension of at least 100 nm, at least 200 nm, at least 300 nm, at least 400 nm, at least 500 nm, at least 600 nm, at least 700 nm, at least 800 nm, at least 900 nm, at least 1 µm, at least 2 µm, or at least 3 µm.

5. The method of claim 1, wherein the nanoplates have a thickness of up to 39 nm, up to 36 nm, up to 33 nm, up to 30 nm, up to 27 nm, up to 24 nm, up to 21 nm, up to 18 nm, up to 15 nm, up to 12 nm, up to 9 nm, or up to 6 nm.

6. The method of claim 1, wherein a surface coverage of the substrate by the nanoplates is at least 70%, at least 80%, at least 90%, at least 95%, at least 98%, at least 99%, or at least 99.5%.

7. The method of claim 1, wherein neighboring ones of the nanoplates in the thin film form plane-to-plane contacts.

8. The method of claim 1, wherein applying the ink composition is via spin-coating, dip-coating, screen printing, or inkjet printing.

9. The method of claim 1, wherein annealing the coating is via thermal annealing at a temperature in the range of 150° C. to 400° C., 150° C. to 300° C., 300° C. to 400° C., or 240° C. to 350° C.

10. The method of claim 1, wherein annealing the coating is via laser annealing.

11. The method of claim 1, wherein a carrier mobility of the thin film at 300 K is at least 20 $cm^2 \cdot V^{-1} \cdot s^{-1}$, at least 30 $cm^2 \cdot V^{-1} \cdot s^{-1}$, at least 40 $cm^2 \cdot V^{-1} \cdot s^{-1}$, at least 50 $cm^2 V^{-1} \cdot s^{-1}$, at least 60 $cm^2 V^{-1} \cdot s^{-1}$, at least 70 $cm^2 V^{-1} \cdot s^{-1}$, at least 80 $cm^2 \cdot V^{-1} \cdot s^{-1}$, at least 90 $cm^2 \cdot V^{-1} \cdot s^{-1}$, at least 100 $cm^2 \cdot V^{-1} \cdot s^{-1}$, or at least 110 $cm^2 \cdot V^{-1} \cdot s^{-1}$.

12. The method of claim 1, wherein a conductivity of the thin film at 300 K is at least 100 $S \cdot cm^{-1}$, at least 200 $S \cdot cm^{-1}$, at least 300 $S \cdot cm^{-1}$, at least 400 $S \cdot cm^{-1}$, at least 500 $S \cdot cm^{-1}$, at least 600 $S \cdot cm^{-1}$, or at least 700 $S \cdot cm^{-1}$.

13. A method of forming nanoplates, comprising:
combining a metal-containing precursor, a chalcogenide-containing precursor, a capping agent, and a reducing solvent to form a reaction mixture; and
heating the reaction mixture to form nanoplates of a metal chalcogenide,
wherein the nanoplates have a lateral dimension of at least 500 nm, and have a thickness of up to 9 nm.

14. The method of claim 13, wherein the capping agent is poly(vinylpyrrolidone).

15. The method of claim 13, wherein the reducing solvent is a polyol.

16. The method of claim 13, wherein heating the reaction mixture is carried out at a temperature in the range of 100° C. to 300° C. or 150° C. to 200° C., and for a duration in the range of 0.4 hr to 5 hr or 1 hr to 4 hr.

17. The method of claim 13, wherein the metal is a transition metal or a post-transition metal.

18. The method of claim 13, wherein the metal is selected from Bi, Mo, W, Ta, Ti, Sn, and Nb, and the chalcogenide is selected from Se, Te, and S.

19. The method of claim 13, wherein the lateral dimension of the nanoplates is at least 2 µm or at least 3 µm, and the thickness of the nanoplates is up to 6 nm.

20. The method of claim 13, wherein the metal chalcogenide is a first metal chalcogenide, and the method further comprises performing epitaxial growth of a second metal chalcogenide over the nanoplates, and the second metal chalcogenide is different from the first metal chalcogenide.

21. The method of claim 1, wherein the nanoplates have a hexagonal geometry.

22. The method of claim 1, wherein the thin film has a homogeneous composition of the layered material.

* * * * *